United States Patent [19]

Schmotz et al.

[11] Patent Number: 4,628,146
[45] Date of Patent: Dec. 9, 1986

[54] CASING FOR ELECTRICAL COMPONENTS, COMPONENT ASSEMBLIES OR INTEGRATED CIRCUITS

[75] Inventors: Ernst Schmotz, Willing; Hans Stelzl, Vaterstetten, both of Fed. Rep. of Germany

[73] Assignee: Siemens Aktiengesellschaft, Berlin and Munich, Fed. Rep. of Germany

[21] Appl. No.: 701,057

[22] Filed: Feb. 13, 1985

[30] Foreign Application Priority Data

Mar. 23, 1984 [DE] Fed. Rep. of Germany ....... 3410787

[51] Int. Cl.⁴ ............................................. H05K 5/06
[52] U.S. Cl. ........................... 174/52 PE; 310/313 R; 333/194
[58] Field of Search ............. 174/52 S, 52 PE; 264/272.11; 310/313 R; 333/185, 193, 194

[56] References Cited

U.S. PATENT DOCUMENTS 3,693,252  9/1972  Robertson et al. ......... 174/52 PE X
4,034,318  7/1977  Ishiyama .............................. 333/193
4,291,285  9/1981  Kadata ............................ 333/194 X
4,369,330  1/1983  Pilz ................................. 174/52 FP
4,480,148  10/1984  Archer ....................... 174/52 PE X

FOREIGN PATENT DOCUMENTS 3131887  2/1983  Fed. Rep. of Germany .

Primary Examiner—Arthur T. Grimley
Assistant Examiner—D. A. Tone
Attorney, Agent, or Firm—Thomas H. Jackson

[57] ABSTRACT

A casing for electrical components, component assemblies or integrated circuits, and particularly for electrical surface-wave filters, is disclosed as well as a method of production therefor where the electrically active element rests on a base strip from which project outgoing connectors through the casing walls. The connectors provide mechanical and electrical connection to printed circuit boards. A thermosetting-plastic trough adheres closely to the underside of the base strip, while the side-wall reels of the trough rest on the borders of the upper surface of the base strip. Over the trough is placed a thermosetting-plastic lid so that the active element is contained in an enclosure. The trough-and-lid assembly is then coatable in thermosetting plastic.

6 Claims, 3 Drawing Figures

CASING FOR ELECTRICAL COMPONENTS, COMPONENT ASSEMBLIES OR INTEGRATED CIRCUITS

BACKGROUND OF THE INVENTION

1. Technical Field

This invention relates to a casing for electrical components, component assemblies or integrated circuits, particularly for electrical surface-wave filters, where the electrically active element rests on a base strip which projects connectors through the walls of the casing, the connectors providing mechanical and electrical connection to a printed circuit board.

2. Description of the Prior Art

German Pat. No. 30 11 730 discloses a hermetically sealed casing consisting of a rectangular shell and an inside-fitting lid, hermetically sealed by synthetic-resin casting. The opposite shell walls have openings closely adapted to 90°-bent connectors of the electrical component, and the shell has a peripheral indentation which, together with an outside web of the lid, forms an encircling, synthetic-resin filled groove.

German Pat. No. 31 31 887 discloses an electrical component, particularly an electrical surface-wave filter and a production process according to which the active element of the electrical component is attached to a metallic support and, together with its connecting lugs, is enclosed in an electrically conductive synthetic-resin casing. In the process, at least one of the lugs is galvanically connected to the synthetic-resin casing by an electrically conductive cement. The metallic base is formed so as to project the necessary grounding lug as well. During assembly this lug comes as close as possible to the internal surface of the synthetic resin casing, making possible the connection by cementing.

All of these electrical components, component assemblies and integrated circuits rest on bases consisting usually of a metal sheet provided with outgoing connectors through their casings for connecting them to printed circuit boards. During assembly the outgoing connectors are either left in the base plane or bent at right angles. In the case of integrated circuits or semiconductor components, the connectors are usually injection-coated. In some cases, the electrical component, or the integrated circuit, must be enclosed in a hollow space inside the casing, sometimes filled with an inert gas.

SUMMARY OF THE INVENTION

The object of the present invention is to build a casing of the kind described above but which is particularly suitable to the protection of an active component such as a surface-wave filter-chip. The present casing creates a hermetic water-proof sealed enclosure for the chip, while the connectors protruding from this enclosure may be easily soldered flat on to an etched circuit board.

According to the invention, a trough made of thermosetting plastic adheres closely to the underside of a base strip on which rests the chip while the heels of its side walls rest on the borders of the upper side of the base strip. A trough-shaped thermosetting-plastic lid covers the trough either by lying upside down over it or by being set inside its stepped contours creating an enclosure over the surface-wave filter-chip or other active component. The trough-and-cover assembly is coated in a thermosetting-plastic material.

The manufacture of the trough and of its lid, as well as their coating, are preferably done in sequence in separate injection moldings, a procedure which significantly simplifies production.

The thermosetting plastics used should have a high thermal resistance, a feature especially necessary for immersed soldering where the casing's electrical connectors are soldered to printed circuit boards. The hermetic water-proof insulation of the enclosure is mainly the result of the satisfactory adherence of the thermosetting plastic material to metallic elements.

The invention is described in more detail with the help of the following figures from which description other embodiments and advantages of the present invention will become apparent.

DETAILED DESCRIPTION

Figure 1:
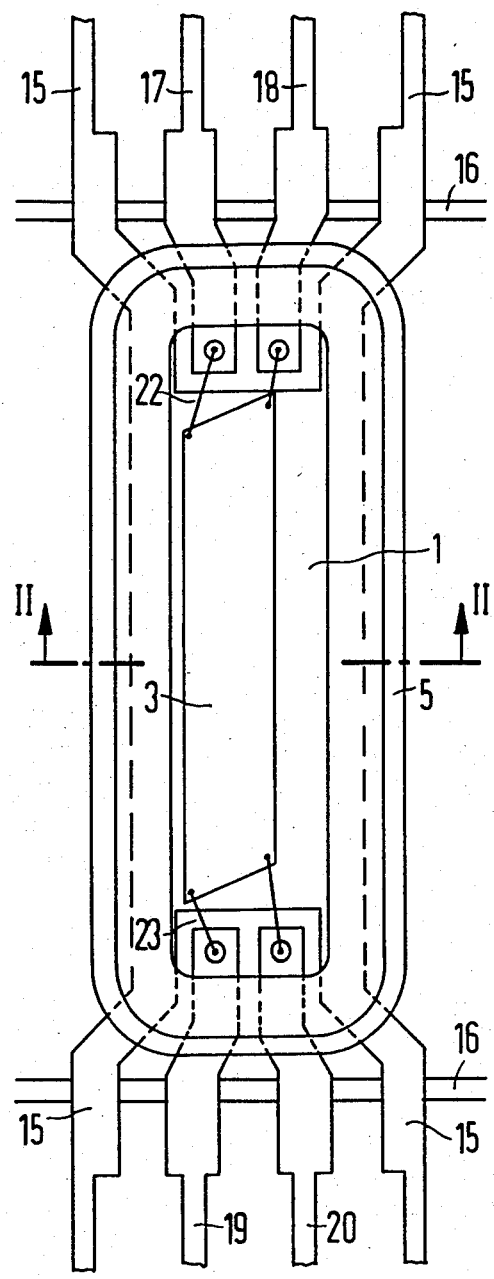
FIG. 1 is an enlarged-scale view from above of an assembly according to the invention comprising a surface-wave filter, in which the trough shaped lid and coating of the assembly are not shown.

Referring to FIG. 1, the supporting base strip 1 may be seen which is stampable from a Cu-Fe-metal sheet, the base strip for supporting a surface-wave filter chip 3 or other active component soldered to the base.

The filter input and output transducers (which by way of simplification are not shown in FIG. 1) are mounted on wire connectors 22 and 23 leading to lugs 17, 18 and 19, 20, respectively, which may be stamped out of the same metal sheet as the base. Lugs 15 are grounding lugs, symmetrically disposed to lugs 17, 18, 19 and 20 and are also stamped from the same metal sheet as base 1. Lugs 15 operate as short-circuiting loops which, by their induced currents, decrease the fields created by the in- and outflowing currents, and, consequently, the coupling of filter input and output.

Figure 2:
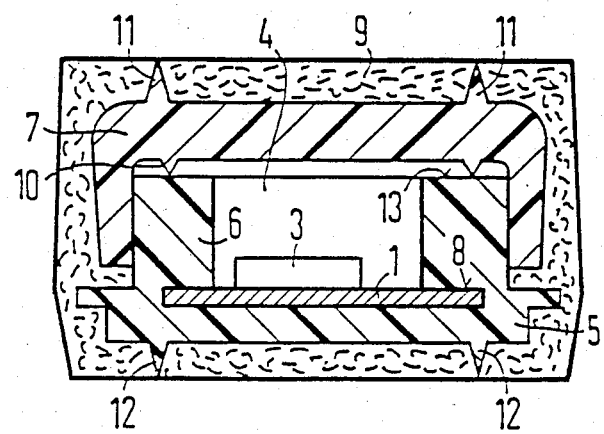
FIG. 2 is a cross-section along line II—II (in FIG. 1), showing the trough, the trough-shaped lid, and the coating.

During the manufacture of the casing, the one-piece stamped element, comprising the base-strip 1 and the lugs 15–20 together with connectors 22 and 23 rest on web-like supporting devices 16 only by means of the grounding lugs 15. The supporting devices 16 are built so that lugs 17–20 may be isolated from grounding lugs 15. Referring to FIG. 1 and FIG. 2, it is seen that during the first injection phase, a thermosetting-plastic trough 5 is manufactured, adhering closely to the underside of base strip 1, while the heels of its side walls 6 rest on the borders of the upper side 8. From the underside of the trough 5, ridges 12 protrude toward the outside.

A trough-shaped lid 7, provided with ridges 10, 11, is also manufactured preferably by injection of thermosetting-plastic material. The lid is laid upside down over trough 5, resting on the trough side-wall crown 13 by means of ridges 10. The trough-and-lid assembly creates an enclosure which hermetically houses the surface-wave filter-chip 3. Instead of using ridges 10, an alternative solution would be to have the side-wall crown 13 provided with similar ridges, but inverted.

During the last injection phase, the trough-and-lid assembly 5 and 7 is coated with thermosetting plastic 9, realizing the hermetic insulation of the enclosure 4. It may be noted that the trough-like shape of lid 7 prevents the penetration of injection material into enclosure 4 during coating of the assembly 5 and 7.

Figure 3:
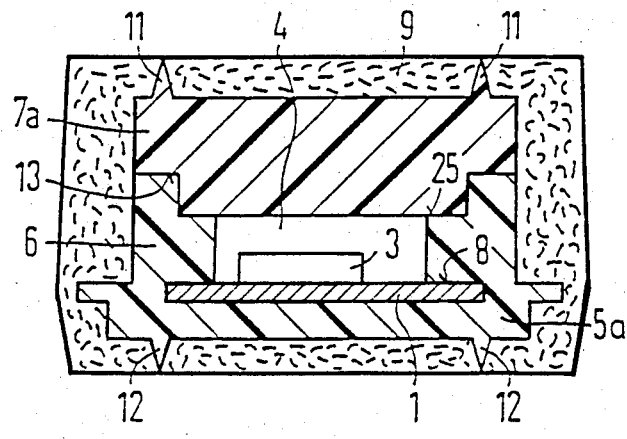
FIG. 3 is an alternative embodiment to the cross-section shown in FIG. 2, particularly depicting an alternative means for joining a lid and trough, where the lid is not trough-shaped but is set inside the stepped contours of the trough.

According to FIG. 3, the trough-shaped lid 7 may be replaced by a lid 7a with supporting surfaces having steps 25 facing a trough 5a and resting on the trough 5a whose trough wall crowns 13 are correspondingly stepped.

Referring briefly to FIG. 1, the ends of the injection-embedded lugs and connectors, freed by removal of supporting webs 16, can be either bent and plugged into corresponding holes of a printed circuit board, or soldered flat on respective circuits.

What is claimed is:

1. A casing for electrical components having an electrically active element where the electrically active element rests on a base strip which projects outgoing connectors through walls of the casing, the connectors providing mechanical and electrical connection to a printed circuit board, the casing comprising a thermosetting-plastic trough which adheres closely to the under surface of the base strip, and having side-walls each having a heel which rests on a border of the upper surface of the base strip, and a thermosetting-plastic lid which is positioned over the thermosetting-plastic trough to form an assembly, the electrically active element being contained in an enclosure of the assembly of thermosetting-plastic trough and lid, the assembly including the enclosed electrically active element being coated in thermosetting plastic.

2. A casing according to claim 1, wherein the thermosetting-plastic lid is trough-shaped and is positioned trough side down over the thermosetting-plastic trough.

3. A casing according to claim 2, wherein the thermosetting-plastic trough-shaped lid rests on the thermosetting plastic trough by means of ridges protruding from the underside of the lid towards a crown of the sidewall of the trough.

4. Casing according to claim 2, wherein each crown of the side-walls of the trough has ridges for supporting the lid.

5. Casing according to claim 1, wherein the trough and lid have correspondingly stepped contact surfaces.

6. Casing according to claim 1, wherein the thermosetting-plastic trough, lid and assembly coating are produced by separate injection moldings.

* * * * *